United States Patent [19]

Gleria et al.

[11] Patent Number: 5,041,524

[45] Date of Patent: Aug. 20, 1991

[54] POLYPHOSPHAZENE DERIVATIVES CONTAINING CARBONYL GROUPS SUITABLE FOR PHOTORETICULATION PROCESSES

[75] Inventors: Mario Gleria, Padova; Francesco Minto, Mestre; Lucia Flamigni, Casalecchio Di Reno, all of Italy

[73] Assignee: Consiglio Nazionale Delle Ricerche, Rome, Italy

[21] Appl. No.: 437,352

[22] Filed: Nov. 16, 1989

[30] Foreign Application Priority Data

Nov. 16, 1988 [IT] Italy ............................ 22631 A/88

[51] Int. Cl.$^5$ .............................................. C08G 6/00
[52] U.S. Cl. .................................... 528/220; 528/167; 528/168; 528/169; 528/222; 528/224; 528/399; 528/400; 525/538
[58] Field of Search ............... 528/220, 222, 224, 399, 528/400, 167, 168, 169; 525/538

[56] References Cited

U.S. PATENT DOCUMENTS

| | | | |
|---|---|---|---|
| 4,558,103 | 12/1985 | Hergenrother et al. | 525/538 |
| 4,657,993 | 4/1987 | Lora et al. | 525/538 |
| 4,806,322 | 2/1989 | Hergenrother et al. | 423/300 |

*Primary Examiner*—Morton Foelak
*Assistant Examiner*—Sam A. Acquah
*Attorney, Agent, or Firm*—Birch, Stewart, Kolasch & Birch

[57] ABSTRACT

Polyphosphazene derivatives containing carbonyl groups which are apt to undergo rapid photoreticulation processes having the general formula

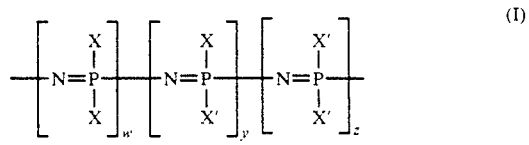

(I)

in which:
X represents substituents bound to the polyphosphazene chains by means of hydroxy or amino functions, and containing carbonyl groups;
X' represents additional substituents bound to the polyphosphazene chain through hydroxy or amino functions and containing one or more easily extractable hydrogen atoms;
(w+y+z) is an integer between 20 and 15,000;
w and z are integers greater than or equal to 0 and always lower than 15.000;
y is an integer between 20 and 15,000.

19 Claims, 2 Drawing Sheets

POLYPHOSPHAZENE DERIVATIVES CONTAINING CARBONYL GROUPS SUITABLE FOR PHOTORETICULATION PROCESSES

FIELD OF THE INVENTION

The present invention relates to polyphosphazene derivatives apt to undergo rapid photoreticulation processes when irradiated as thin films with UV and visibile radiations.

PRIOR ART

Methods for the preparation of polyphosphazene derivatives containing substituted and non substituted alkoxy-fluoroalkoxy, aryloxy and ammino groups bound to the phosphor atoms, have been described in prior publications, as for instance:

(a) H. R. Allcock "Phoshorus-Nitrogen Compounds", Academic Press, New York, 1972;
(b) H. R. Allcock, "Poly(organophosphazenes)—Unusual New High Polymers.", Angew. Chem. Int. Ed. Engl. 16,147(1977)
(c) H. R. Allcock, "Poly(organophosphazenes)", Chem. Tech. 19, 1979;
(d) H. R. Allcock, "Polymerization of Cyclic Phosphazenes", Polymer 21,673 (1980);
(e) H. R. Allcock, "Polyphosphazenes, and the Inorganic Approach to the Polymer Chemistry", Sci. Prog.Oxf. 66,355 (1980);
(f) H. R. Allcock, "Controlled Synthesis of Organic-Inorganic Polymers that possess a backbone of phosphorus and nitrogen Atoms". Makromol. Chem. Suppl. 4,3 (1981);
(g) G. L. Hagnauer, "Polydichlorophosphazene Polymerization Studies", J. Makromol. Sci. Chem. A16, 385 (1981);
(h) H. R. Allcock, "Inorganic Macromolecules", Chem. Eng. News 22(1985).

Such publications illustrate furthermore, the very wide possibilities of practical industrial and commercial use of cyclic and polymeric phosphazene derivatives.

In some of said publications the synthesis of polyphosphazene derivatives is described wherein the derivatives have a general structure of type (I) in which y and z are 0, that is, they contain only keto-(aliphatic, aromatic or alkyl aromatic) or quino groups.

Up to now, however, no publication describes or suggests the synthesis of poliphosphazene materials of general formula (I) in which y and z are different from 0 and the keto- or quino groups represented by the X substituents are present in the phosphazene nucleus together with other substituent groups of an alkoxy, aryloxy or ammino type containing easily extractable hydrogen atoms, represented in the formula by the X' substituents.

Furthermore, no publication describes or suggests the use of polyphosphazene compounds represented by the general formula (I) as materials which are apt to undergo rapid and efficient photoreticulation processes and presenting as such potential usefullness in non conventional systems (systems, that is, non based on the use of silver halides) for the reproduction of images, or a potential application in microelectronic uses for the preparation of printed circuits, in microlithography, etc.

SUMMARY

The present invention relates to polyphosphazene compounds containing carbonyl groups, which are apt to undergo photoreticulation processes when exposed, as films, to UV and visible radiations, said compounds having the general formula (I)

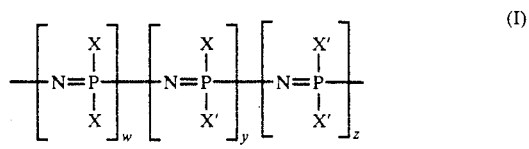

in which:

X represents substituents bound to the polyphosphazene chain through hydroxy or amino functions, and containing carbonyl groups;

X' represents additional substituents bound to the polyphosphazene chains by means of hydroxy or amino functions and containing one or more easily extractable hydrogen atoms;

$(w+y+z)$ is an integer between 20 and 15,000, w and z are integers greater than or equal to 0, but in any case lower than 15,000;

y is an integer comprised between 20 and 15,000.

The $y/(y+w+z)$ ratio has a value as near as possible to one, so as to obtain a product with maximum efficiency in the photoreticulation process.

The derivatives according to the present invention are prepared by a process which uses, as reagents to obtain the x and X' substituents, compounds containing hydroxy or amino groups, and is characterized in that, when said compounds contain hydroxy groups, said compounds dissolved in an organic solvent are reacted with sodium hydride in a stoichiometric ratio and the obtained sodium salts are reacted with polydichlorophosphazenes of general formula $(NPCl_2)_n$ where n is an integer comprised between 20 and 15,000, possibly in the presence of a tetra alkylammonium halide and, when such compounds contain hydroxy or amino groups they are reacted with the polydichlorophosphazene in the presence of a tertiary amine, in a reaction medium consisting of an organic solvent in which the initial reagents and the final polyphosphazene derivatives are both soluble.

DETAILED DESCRIPTION OF THE INVENTION

Figure 1:
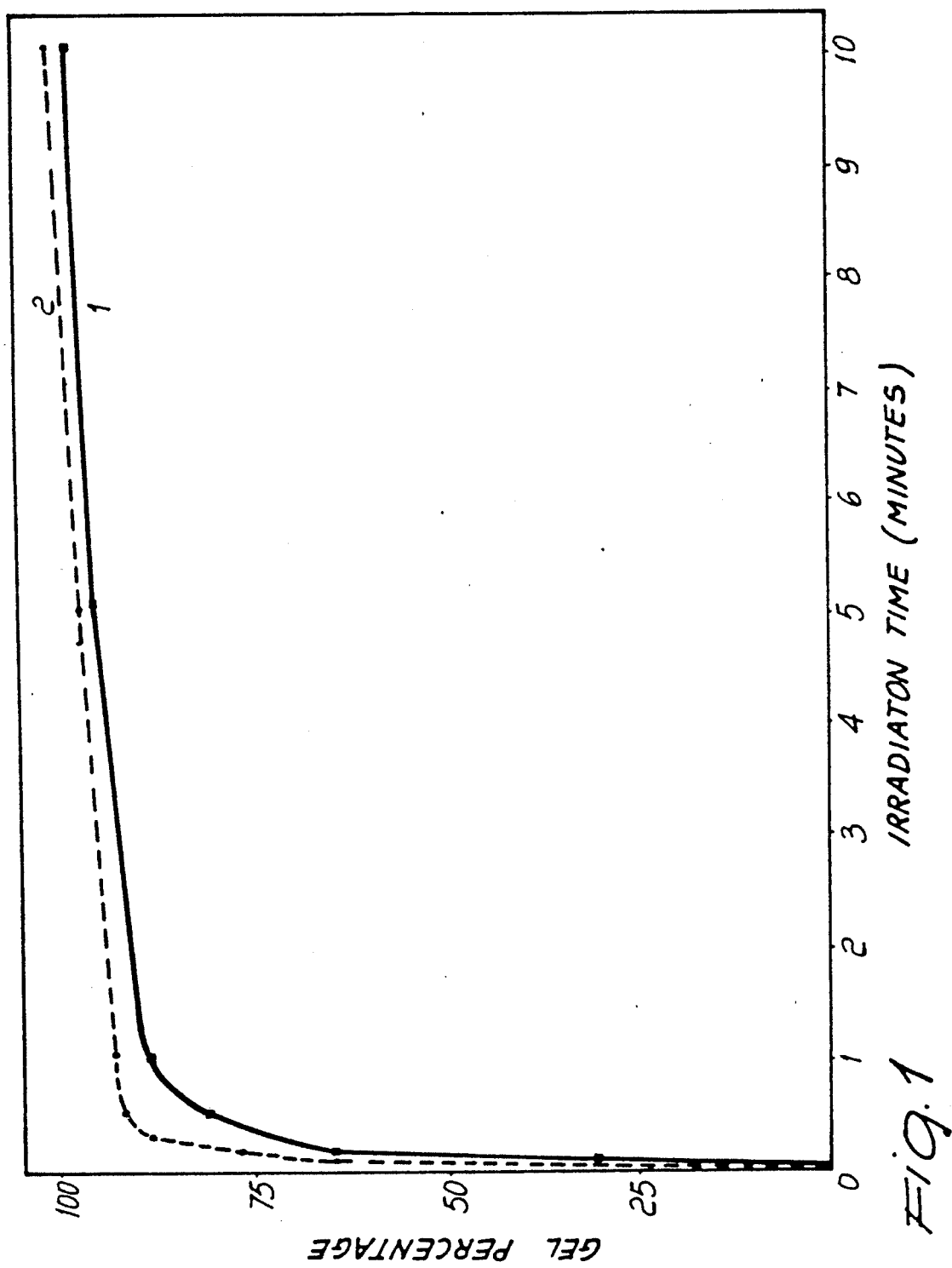

The characteristics of the polyphosphazene derivatives according to the invention and of the process for their preparation will be put in evidence with more detail in the following detailed description. Said derivatives have the general formula (I)

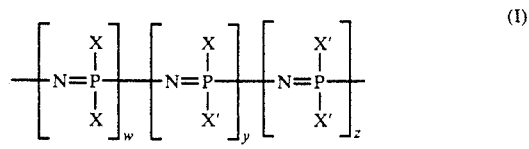

in which:

X represents substituents deriving from hydroxy or amino-substituted carbonyl compounds having the following formulae

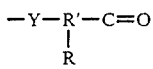

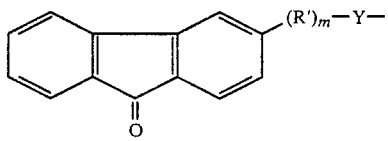

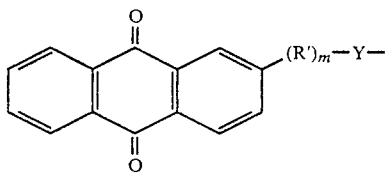

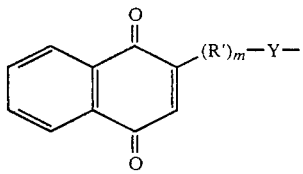

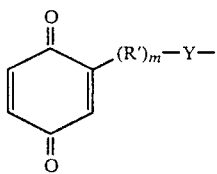

in which:
Y represents —O— or —NH—;
R represents a linear or branched alkyl group containing between 1 and 30 carbon atoms, or an aryl group;
R' represents CH$_2$ or a substitued or non-substituted aryl or heterocyclic group;
m is an integer between 0 and 5;
X' represents additional substituents having one or more easily extractable hydrogen atoms, derived from aliphatic alcohols or amines having linear or branched chains containing between 1 and 30 carbon atoms, of the general formula:

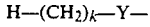

in which
k is an integer between 1 and 30;
Y represents —O— or —NH—;
or X$^1$ is derived from aromatic phenols or amines, variously substitued on the ring by groups suitable to easily supply hydrogen atoms, such as alkyl groups of various nature and magnitude, of the general formula:

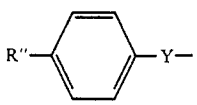

where:
R" represents a linear or branched radical such as methyl, ethyl, propyl, butyl, pentyl, hexyl, heptyl, octyl, etc. with a linear or branched chain and Y represents —O— or NH—;
(w+y+z) is an integer between 20 and 15,000;
w and z are integers higher than or equal to 0 and in any case lower than 15,000;
y is an integer comprised between 20 and 15,000.

For the preparation of polyphosphazene derivatives according to the invention, said compounds are reacted directly or, in case said compounds possess hydroxy functions, preferably after reaction with sodium hydride, with polydiclorophosphazenes of general formula:

where
n is an integer comprised between 20 and 15,000.

The polyphosphazene compounds of the present invention are synthesized in such a way as to have the maximum possible value for y and the lowest possible values for w and z, in order to have the maximum efficiency in a photoreticulation process.

The preferred value of y/(y+w+z) is near 1.

The order in which the reagents which are apt to give X' substituents are reacted with the polydychlorophosphazene is determined by the basicity of the substituents themselves.

In particular, one reacts first the more basic substituent, leaving as second the one of lower basicity.

This method is employed to the end of avoiding an exchange reaction between a lower basicity substituent made to react first and already bound to the phosphazene chain, with one of higher basicity which enters onto the molecule later.

Furthermore the substituent which is reacted first is employed in a quantity exactly equivalent to the theoretical quantity of chlorine which has to be substituted, which normally is 50% of that originally available in the polydichlorophosphazene, while the one reacting second has to be used in a large excess (up to 100%) of the theoretical in order to have the maximum possible chlorine substitutions occur.

In case both groups X and X' have equivalent basicity the corresponding compounds may also be dissolved in a single solvent in equimolecolar quantities and made to react together.

For the preparation of the polyphosphazene derivatives according to the present invention, the reaction conditions and the ratios between the employed reagents may vary widely depending on factors such as the reactivity of the compounds which yield the X and X' substituents, the type of employed tertially amine, and the desired substitution degree in the final polymer.

In general, the reaction temperature may vary between 25° and 250° C. and the time necessary for the complete substitution of the chlorine in the polydichlorophosphazene between 1 and 7 days; low reaction temperatures require longer reaction times, and vice versa higher reaction temperatures allow for shorter reaction times.

The reaction is carried out in an organic solvent or in a mixture of organic solvents.

The solvents employed in the reaction must be solvents for the polydichlorophosphazene, for the compounds which yield the X and X' substituents containing hydroxy functions, for their sodium salts, for the compounds which yield the X and X' substituents containing amino groups, for the tertiary amines and furthermore for the obtained polyphosphazene derivative.

The solvents normally employed are: diglyme, triglyme, methylene chloride, chloroform, tetrahydrofurane, dioxane, benzene, toluene and xylene.

The amount of solvent is not critical, and any amount sufficient to completely solubilize the reagent substances may be employed. Furthermore, in order to eliminate undesired side reactions by the chlorine atoms of the starting polydichlorophosphazene, the solvents must be completely anhydrous.

In general the amount of hydroxy-or ammino-substituted aliphatic, aromatic, alkyl aromatic ketone or quinone as well as the quantity or additional agents which are apt to yield X' when employed in the synthesis must be at least equivalent to the number of chlorine atoms available in the starting polymer; however, if desired, one can employ an excess of keto-or quino-compounds in order to obtain a complete substitution of the chlorine atoms.

As chlorophosphazene to be employed in the preparations of the derivatives according to the invention, a polymer is employed having an essentially linear structure indicated as polydichlorophosphazene $(NPCl_2)_n$ where "n" is an integer between 20 and 15,000.

Polydichlorophosphazene is a highly reactive, rubbery polymeric product, which is unstable in the presence of humidity, which is generally prepared by bulk thermal polymerization, under reduced pressure, starting from low molecular weight cyclic oligomers, such as, for instance, hexachlorocyclophosphazene $(NPCl_2)_3$ and octachlorocyclotetraphosphazene $(NPCl_2)_4$ or a mixture of both.

Among the tertiary amines employed in the preparation of the polyphosphazene derivatives of the present invention, are those represented by the general formula:

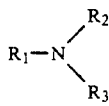

where $R_1$, $R_2$, $R_3$ are each an alkyl group containing between 1 and 8 carbon atoms, such as trimethylamine, triethylamine trisopropylamine, tri-n-propylamine, tri-n-butylamine; however one can also employ N-methyl morpholine, N-methylpyrrol and the like, and furthermore tertiary amines such as pyridine, and those containing diammido groups such as N,N,N',N'-tetramethylendiamine.

The tertiary amines preferably employed are triethylamine and N,N',N'-tetramethylendiamine.

The tetrabutylammoniumhalides act as catalysts in the substitution reaction of polydichlorophosphazene $(NPCl_2)_n$ with the various reagents.

The employed halides are tetrabutylammonium-iodide, -bromide, and -chloride.

The most preferably employed halide is tetrabutylammonium bromide.

The keto-or-quino compounds employed in the reaction with the chlorophosphazene to yield the X substituents are preferably: α-amino- and α-hydroxy-acetone, 4-amino-or 4-hydroxy-benzophenone, 4-amino- or 4-hydroxy acetophenone, 4-amino-or 4-hydroxypropiophenone, 4-amino or 4-hydroxy-valero phenone, 2-amino-and 2-hydroxy fluorenone, 2-hydroxymethyl anthraquinone, 1-or 2-aminoanthraquinone, 2-hydroxy naphthoquinone.

The additional reagents yielding the X' substituents are preferably aliphatic alcohols having linear or branched chains, containing between 1 and 30 carbon atoms (such as methanol, ethanol, propanol, pentanol, hexanol, heptanol, octanol, nonanol, decanol, undecanol and the like), aromatic alcohols such as phenols, variously substituted on the rings with alkyl groups of various nature and complexity (such as cresols, xylols, ethyl phenols, propyl phenols, butyl phenols, pentyl phenols, amyl phenols, octyl phenols and similar derivatives); primary and secondary aliphatic amines (methyl, ethyl, dimethyl, diethyl, propyl, butyl amine and the like) aniline and substituted aromatic amines such as toluidine, ethyl aniline, propyl aniline, butyl aniline and the like.

The polyphosphazene derivatives according to the present invention present, with respect to the known products presently employed in common industrial applications, the advantage that it is possible to easily modify, within very wide limits, their physico-chemical properties and therefore also their photoreactivity, operating in the following ways:

(a) suitably varying the X substituents by selecting them in a suitable way among the above indicated classes of compounds;
(b) suitably varying the X' substituents by selecting them in a suitable way among the above indicated classes of compounds;
(c) suitably varying the $$\frac{y}{w + y + z}$$

ratio.

In this way one obtains phosphazene copolymers having different characteristics and properties suitable for various experimental situations, capable of reticulating with variable efficiency and rapidity.

As far as the use of the phosphazene copolymers according to the present invention are concerned, they may be used as flexible, elastic and adhesive films, which are spread on glass or quartz substrates, and successively irradiated for variable times with UV or visible radiations.

The polymeric film, in the surface area exposed to the incident radiation, undergoes a reticulation process induced by the light, the duration of which may vary from a few seconds to a few minutes, which leads to a very high (in some cases total) reticulation of the polymer.

Said process of photoreticulation of the phosphazene copolymers of the present invention may be employed in the photographic field as a non conventional system (that is not based on the use of silver halides) for the reproduction of images.

In fact, in case the surface of the polymeric film exposed to the light radiations is partially covered by a mask non transparent to the incident radiations, the film portion protected by said mask keeps unchanged its initial solubility, while the remaining film portion reticulates.

The film portion which remains soluble may then be dissolved with suitable solvents and removed from the substrate, leaving on it an image which exactly reproduces the employed protective mask.

Photoreticulation processes of this type may find application also in a microelectronic technique for the preparation of printed circuits, in microlithography, etc.

The following examples are reported to illustrate the invention without any limitation.

EXAMPLE 1

Preparation of a phosphazene copolymer having the following composition:

4-hydroxybenzophenone 50%, 4-isopropylphenol 50%

$$\{NP[O-C_6H_4-CO-C_6H_5]_1[O-C_6H_4-CH(CH_3)_2]_1\}_n$$

8.8 g ($=7,586.10^{-2}$ mol$=0.1517$ eq) polydichlorophosphazene are charged into a three neck 1000 ml flask and are dissolved under mild heating in about 100 ml anhydrous dioxane.

In another 1000 ml flask are charged 5.5 g of 60% sodium hydride suspended in aproximately 60 ml dioxane. A 4-isopropylphenol solution (10.39 g $=7586.10^{-2}$ mol) in 70 ml anhydrous dioxane separatly prepared in a funnel is added dropwise to this suspension. At the end of the addition the suspension is heated to reflux for about 4 hours in order to have a complete reaction of the phenol.

The phenate is then filtered very slowly and in a nitrogen atmosphere directly into the polydichlorophosphazene solution. The solution is kept under stirring at reflux for 24 hours.

At the beginning of this 24 hour period the sodium salt of 4-hydroxybenzophenone is prepared: this preparation is carried out 24 hours in advance, so that both the partially substituted polymer and the hydroxybenzophenone would be ready at the same moment.

12.4 g (0.3034 mol) 60% NaH and 2 g tetrabutylammonium bromide are charged into a three neck 2000 ml flask and are suspended in about 100 ml anhydrous dioxane.

58 g of 4-hydroxybenzophenone is separately weighed in a charging funnel, dissolved in 300 ml dioxane and added drop by drop, very slowly, to the sodium hydride suspension.

Hydrogen gas is developed by the addition. At the end of the addition the suspension is heated on reflux for about 24 hours. At the end of this period the solution of the partially substituted polymer is added very slowly and under stirring to the 4-hydroxybenzophenone sodium salt suspension and the mixture is kept on mild reflux for 5 days.

At the end of this time, the polymer is cooled and there is poured in an excess of water. A white solid precipitates which is dissolved in THF and precipitated again in water two more times, dissolved again (twice) in THF and re-precipitated in n-heptane; dissolved again in THF and re-precipitated in a ethyl ether/n heptane 50% mixture.

A white, gummy polymer is obtained, which is dried under reduced pressure for 2 days.

All the syntesis and purification operations of this copolymer have to be made in darkness or under red light, in order to avoid fortuitous photoreactions during the operations.

EXAMPLE 2

Preparation of a phosphazene copolymer having the following composition:

4-hydroxybenzophenone 50%, 4-sec-butylphenol 50%

$$\{NP[O-C_6H_4-CO-C_6H_5]_1[O-C_6H_4-CH(CH_3)(C_2H_5)]_1\}_n$$

The preparation of this copolymer is carried out as described in example 1, employing 4-sec-butylphenol instead of 4-isoprophylphenol, taking the same precautions in as far as the conditions of darkness are concerned.

EXAMPLE 3

Synthesis of the copolymer having the following composition:

4-hydroxybenzophenone 50%, 4-tert-octylphenol 50%

$$\{NP[O-C_6H_4-CO-C_6-H_5]_1[O-C_6H_4-C(CH_3)_2-C(CH_3)_3]_1\}_n$$

In the X' substituent (tert-octylphenol) of this copolymer there is contained, differently from preceeding examples 1 and 2, no easily extractable hydrogen atoms bound to tertiary carbon atoms; however a long aliphatic chain branched in the 4 position is present on the aromatic phenol ring.

Also in this case the preparation is carried out following the procedure of example 1 operating in darkness during the synthesis as well as during the purification of the copolymer.

EXAMPLE 4

Photoreticulation of the product of example 1 with cut-off filters.

This copolymer is irradiated as a thin film spread on glass, using a cut-off filter in order to eliminate incident radiations having wave lenghts below 340 nm, operating as follows.

A thin film is prepared by slow evaporation in air of a solution of the polymer dissolved in dichloromethane and drying under vacuum for 2 days.

The film is then irradiated with a 900 W Xenon lamp, placing it at a distance of about 30 cm from the light source, inserting the cut-off filters between the film and the lamp.

It is important to note that, on the basis of spectrophotometric measurements made on the polymer film prior to and after the irradiation, no appreciable variations of the optical density are observed for all the experimented exposure times (up to 10 minutes). The irradiated polymeric film is then put into dichloromethane and left under stirring for several days.

The reticulation degree of the irradiated polymer is determined by measuring the percentage of gel formed under the irradiation.

All the operation and storage of the phosphazene copolymer solutions as well as of the films to be irradiated are carried out in darkness or under red light, to the end of preserving this material from accidental photoreticulation processes during the operations.

The results obtained with this polymer are illustrated in FIG. 1 (curve 1) from which one can see that a very high reticulation of this copolymer may be obtained with an irradiation of a few seconds.

EXAMPLE 5

Photoreticulation of the product of example 1, without cut off filters.

The experiment described in the preceeding example is repeated except that in this case no cut-off filter is inserted between the polymer film and the light source. As can be seen from FIG. 1 (curve 2) the reticulation process takes place in a time even shorter than in example n. 4.

EXAMPLE 6

Evaluation of the entity of the photoreticulation process as a function of the irradiation wave length.

The polymer of example 1, spread in a thin film as described in example 4, is irradiated for equal times (5 minutes) using in the various experiments cut-off filters of variable wave lengths, in order to check the spectral response of this material.

Figure 2:
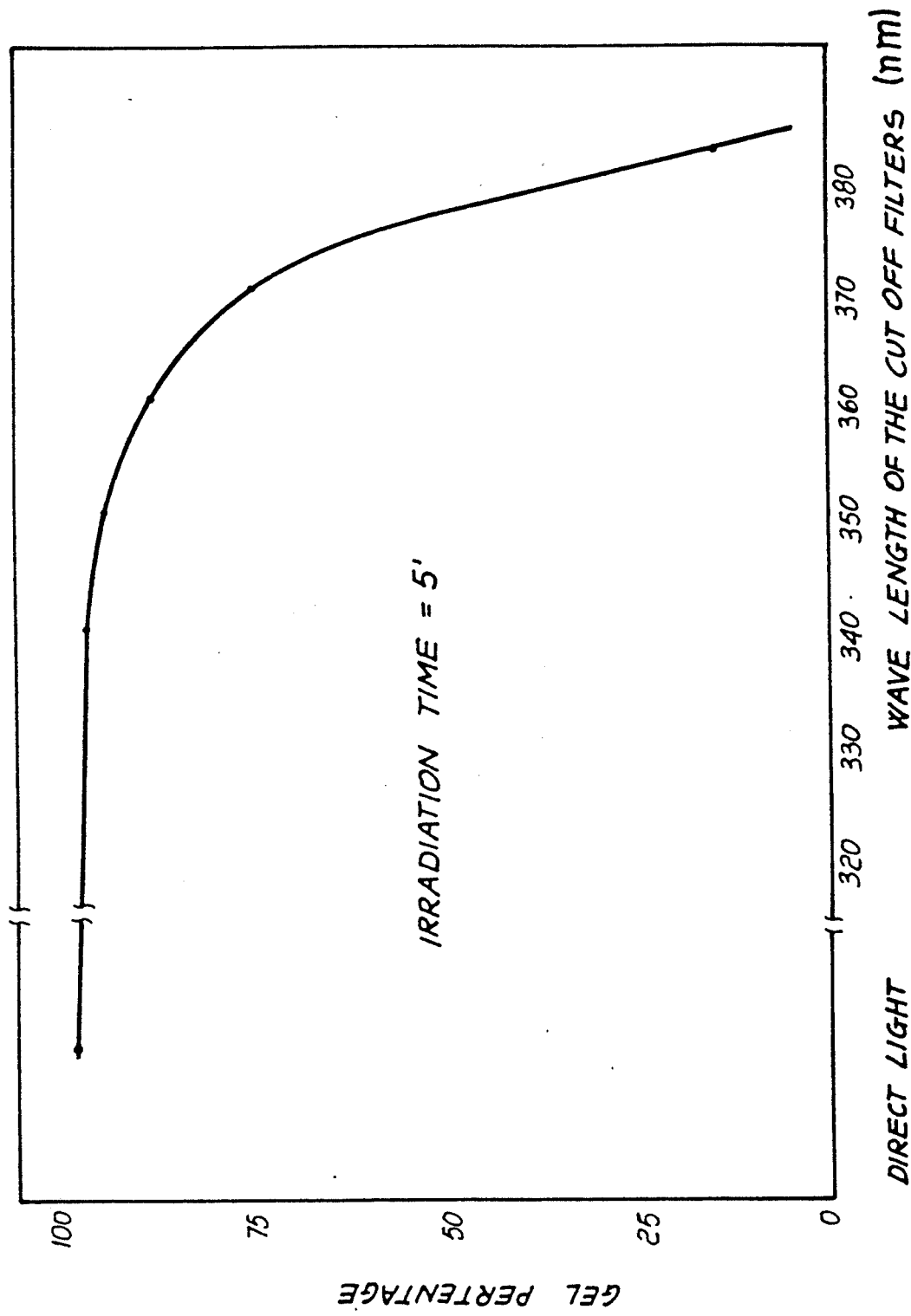

The gel percentage obtained in these experiments, as a function of the irradiations wave length, is reported in FIG. 2, from which one can see that the spectral response of this copolymer varies from the extreme ultraviolet up to about 380–390 nm.

We claim:

1. Polyphosphazene derivatives containing carbonyl groups, having the following general formula (I)

$$\left[-N=P\begin{smallmatrix}X\\|\\X\end{smallmatrix}-\right]_w\left[-N=P\begin{smallmatrix}X\\|\\X'\end{smallmatrix}-\right]_y\left[-N=P\begin{smallmatrix}X'\\|\\X'\end{smallmatrix}-\right]_z \quad (I)$$

in which:
X represents substituents bound to the polyphosphazene chains through hydroxy or ammino functions, and containing carbonyl groups;
X' represents additional substituents bound to the polyphosphazene chains through hydroxy or ammino functions and containing 1 or more easily extractable hydrogen atoms,
(w+y+z) is an integer varying between 20 and 15,000, w and z are integers having a value greater than or equal to 0 and in any case lower than 15,000;
y is an integer comprised between 20 and 15,000.

2. Polyphosphazene derivatives according to claim 1 characterized in that said X substituent have the following formulae:

—Y—R'—C=O
        |
        R

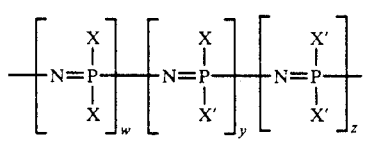

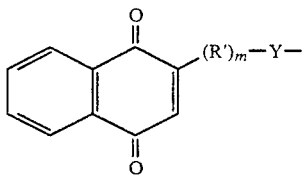

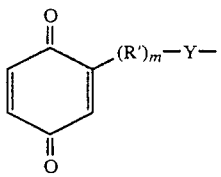

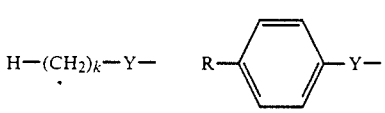

in which:
Y represents —O— or —NH—;
R represents a linear or branched alkyl group containing between 1 and 30 carbon atom or an aryl group;
R' represents —CH$_2$— or an arylic or etherocyclic substituted or unsubstituted group;
m is an integer between 0 and 5.

3. Polyphosphazene derivatives according to claim 1, characterized in that said X' substituents have the following formulae:

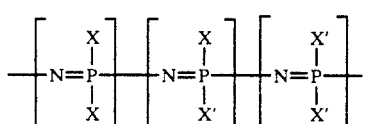

in which:
k represents an integer between 1 and 30, R represents methyl, ethyl, propyl, butyl, pentyl, hexyl, heptyl, octyl, having linear or branched chains and Y represents —O— or —NH—.

4. Polyphosphazene derivatives according to claim 1, characterized in that y/(y+w+z) is approximately 1.

5. Process for the preparation of polyphosphazene derivatives containing carbonyl groups, having the general formula (I)

$$\left[-N=P\begin{smallmatrix}X\\|\\X\end{smallmatrix}-\right]_w\left[-N=P\begin{smallmatrix}X\\|\\X'\end{smallmatrix}-\right]_y\left[-N=P\begin{smallmatrix}X'\\|\\X'\end{smallmatrix}-\right]_z \quad (I)$$

in which:
X represents substituents bound to the polyphosphazene chains through hydroxy or ammino functions, and containing carbonyl group;
X' represents additional substituents bound to the polyphosphazene chains through hydroxy or ammino functions and containing 1 or more easily extractable hydrogen atoms,
(w+y+z) is an integer varying between 20 and 15,000, w and z are integers having a value higher than or equal to 0 and in any case lower than 15,000;
y is an integer comprised between 20 and 15,000,
employing as reagents yielding the X and X' substituents compounds containing hydroxy and ammino groups, characterized in that, when said compounds contain hydroxy groups, these compounds, dissolved in an organic solvent, are reacted with sodium hydride and the obtained sodium salts are reacted with a polydichlorophosphazene of general formula:

(NPCl₂)ₙ where n is an integer comprised between 20 and 15,000, possibly in the presence of a tetraalkylammoniumhalide, and when said compounds contain hydroxy and/or ammino groups, they are reacted with the polydichlorophosphazene in the presence of a tertiary amine, in a reaction medium consisting of an organic solvent in which both the initial reagents and the final polyphosphazene derivatives are soluble.

6. A process according to claim 5, characterized in that said compounds employed to yield the X substituents are:

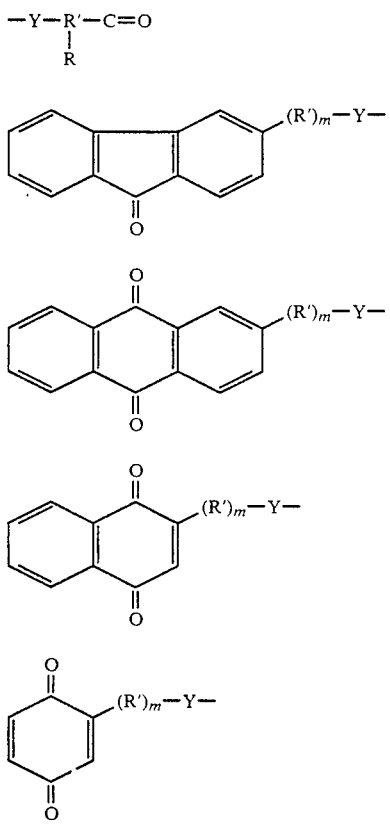

in which:
Y represents —O— or —NH—;
R represents a linear or branched alkyl group, containing from 1 to 30 carbon atoms, or an aryl group, and
R' represents —CH₂ or an aryl or heterocyclic substituted or unsubstituted group;
m is an integer between 0 and 5.

7. A process according to claim 5, characterized in that said compounds employed to yield the X substituents are: alpha-ammino-or alpha-hydroxy-acetone; 4-amino-or 4-hydroxy-benzophenone; 4-amino-or 4-hydroxy-acetophenone; 4-ammino-or 4-hydroxy propiophenone; 4-hydroxy-valerophenone; 2-amino-or 2-hydroxy-fluorenone; 2-hydroxy methyl-anthrachinone; 1-or 2-amino-anthraquinone; 2-hydroxy-naphthoquinone.

8. A process according to claim 5, characterized in that said compounds employed to yield the X' substituents are:

H—(CH₂)ₖ—Y—H

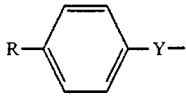

where
k represents an integer between 1 and 30;
R represents a methyl, ethyl, propyl, butyl, pentyl, hexyl, heptyl, or octyl having linear or branched chains and
Y represents —O— or —NH—.

9. A process according to claim 5, characterized in that said compounds employed to yield the X' substituents are methanol, ethanol, propanol, butanol, pentanol, hexanol, dodecanol, cresols, ethylphenols, propylphenols, butylphenols, amylphenols, octylphenols, methoxyphenol, butoxyphenol, methy-ethyl-, propyl-, dimethyl-, diethyl-amine, aniline, toluidine, ethyl aniline, propylaniline, butylaniline.

10. A process according to claim 5, characterized in that the addition of said reagents for the introduction of the X and X' substituents in the (NPCl₂)ₙ molecule may be carried out at the same time for X and X' groups having comparable basicity.

11. A process according to claim 5, characterized in that the addition of said reagents for introducing the X and X' substituents into the (NPCl₂)ₙ molecule is carried out according to a sequence determined by the basicity of the entering groups, the more basic substituent being always substituted first and the less basic second.

12. A process according to claim 5, characterized in that the quantity of said reagents for the introduction of X and X' into the (NPCl₂)ₙ molecule is equivalent at least to the number of chlorine atoms available in the starting polydichlorophosphazene.

13. A process according to claim 5, characterized in that the reaction with polydichlorophosphazene is carried out at a temperature of between 25° and 250° C. for a time of between 1 and 7 days.

14. A process according to claim 5, characterized in that the reaction medium consists of organic solvents such as diglyme, triglyme, methylene chloride, chloroform, tetrahydrofurane, dioxane, benzene, toluene and xylene.

15. A process according to claim 5, characterized in that said tertiary amines are trimethylamine, triethylamine tri-isopropyl amine, tri-n-propylamine, tri-n-butylamine, N-methylmorpholine, N-methylpyrrol, pyridine, N,N,N',N'-tetramethylenediamine.

16. Use of the polyphosphazene derivatives having general formula 1, in photoreticulation processes by film irradiation.

17. Use of the polyphosphazene derivatives having general formula 1 in the reproduction of images by means of a process which does not use silver halides.

18. Use of the polyphosphazene derivatives having general formula 1 in microelectronics, for the construction of printed circuits.

19. Use of the polyphosphazene derivatives having general formula 1 in microlithography.

* * * * *